United States Patent [19]

Han

[11] Patent Number: 5,327,227
[45] Date of Patent: Jul. 5, 1994

[54] DE-INTERLEAVING METHOD AND APPARATUS FOR D2 MAC AUDIO

[75] Inventor: Hong S. Han, Suwon, Rep. of Korea

[73] Assignee: Samsung Electronics Co., Ltd., Kyongki, Rep. of Korea

[21] Appl. No.: 8,465

[22] Filed: Jan. 25, 1993

[30] Foreign Application Priority Data

Jan. 23, 1992 [KR] Rep. of Korea .................. 92-886

[51] Int. Cl.[5] .................. H04N 11/08; H04N 5/60
[52] U.S. Cl. .................. 348/489; 348/738
[58] Field of Search ........ 358/198, 12, 142, 143; 340/825.25, 825.52; H04N 11/08, 5/60

[56] References Cited

U.S. PATENT DOCUMENTS

| 5,097,320 | 3/1992 | Wilkinson | 358/12 |
| 5,101,274 | 3/1992 | Yoshimura | 358/143 |
| 5,113,242 | 5/1992 | Tsinberg | 358/12 |

FOREIGN PATENT DOCUMENTS

| 401638 | 12/1990 | European Pat. Off. | H04N 11/08 |
| 440280 | 8/1991 | European Pat. Off. | H04N 11/08 |
| 444369 | 9/1991 | European Pat. Off. | H04N 11/08 |

*Primary Examiner*—Mark R. Powell
*Attorney, Agent, or Firm*—Sughrue, Mion, Zinn, Macpeack & Seas

[57] ABSTRACT

A de-interleaving system includes a generator for generating a write address for storing input audio data of a D2 MAC signal in units of packets, a generator for generating a read address for de-interleaving the stored audio data of the D2 MAC signal in units of packets so that the audio data is arranged in the sequence of pre-interleaving, a plurality of RAMs for storing the audio data of the D2 MAC signal according to the write address applied from the write address generator and for reading the stored audio data according to the read address applied from the read address generator, and several selectors for receiving the write address and read address from the write address generator and read address generator so as to apply the addresses to corresponding RAMs in units of packets of audio data. The system can enhance the error correction capability by receiving D2 MAC signals interleaved in units of packets and de-interleaving audio data in a normal sequence.

5 Claims, 4 Drawing Sheets

DE-INTERLEAVING METHOD AND APPARATUS FOR D2 MAC AUDIO

BACKGROUND OF THE INVENTION

The present invention relates to a de-interleaving method and apparatus therefor, and particularly to a method for receiving interleaved digital audio data of a D2 MAC mode so as to de-interleave the data into pre-interleaved data. The present application is based on the disclosure of Korean Patent Application No. 92-886 filed Jan. 23, 1992, which disclosure is incorporated herein by reference.

The D2 MAC system developed for television broadcast using a satellite in Europe converts an audio signal into a digital signal and time-division-multiplexes the converted digital signal with a luminance signal and a color difference signal. However, an error is created in a digital audio signal during transmission. Particularly, burst error produced in continuous bit trains of audio signal seriously decreases the error correction capability on the receiving side, compared with a random error independently produced in individual bits. In order to solve such a problem, there has been proposed a method for interleaving and transmitting the digital audio signal of the D2 MAC on the receiving side. Generally, the D2 MAC signal is composed as follows.

One frame consists of 625 lines each of which has 648 bits. Each line is comprised of a 6-bit line sync signal, a 99-bit digital audio signal and a 543-bit analog video signal. The 99-bit digital audio signal substantially contains an audio signal and auxiliary data for processing the audio signal. Since, 751 bits constitute one packet in a digital audio signal to be interleaved, approximately, 8 lines of digital audio signal forms one packet so as to be interleaved. The following TABLE 1 illustrates the interleaving sequence in one packet provided that an audio signal occupies one bit.

TABLE 1

| 1 | 95 | 189 | 283 | 377 | 471 | 565 | 659 |
|---|---|---|---|---|---|---|---|
| 2 | 96 | 190 | 284 | 378 | 472 | 566 | 660 |
| 3 | 97 | 191 | 285 | 379 | 473 | 567 | 661 |
| 4 | 98 | 192 | 286 | 380 | 474 | 568 | . |
| 5 | 99 | 193 | 287 | 381 | 475 | . | . |
| 6 | 100 | 194 | 288 | 382 | . | . | . |
| 7 | 101 | 195 | 289 | . | . | . | 745 |
| 8 | 102 | 196 | . | . | . | 652 | 746 |
| 9 | 103 | . | . | . | 559 | 653 | 747 |
| 10 | . | . | . | 466 | 560 | 654 | 748 |
| . | . | . | 373 | 467 | 561 | 655 | 749 |
| . | . | 280 | 374 | 468 | 562 | 656 | 750 |
| . | 187 | 281 | 375 | 469 | 563 | 657 | 751 |
| 94 | 188 | 282 | 376 | 470 | 564 | 658 | |

One packet of audio data is arranged in the order of 1, 2, 3, ..., 93, 94, 95, ..., 750, 751. The interleaving is carried out by re-arranging the data in the horizontal sequence of TABLE 1. That is, the data is re-arranged in the sequence of 1, 95, 189, ..., 659, 2, 96, ..., 564, 658 by 94-bit-interval interleaving.

Though errors occur in audio data which is interleaved so as to be transmitted, if de-interleaving is carried out on the receiving side, corresponding to the transmitting-side interleaving, since the burst error is converted into random error, the error correction capability would be improved. However, until now, there has not been proposed a de-interleaving system in which audio data interleaved basically in units of packets is converted into pre-interleaved audio data, and therefore an improvement of error correction capability cannot be expected.

SUMMARY OF THE INVENTION

To overcome the above problem, an object of the present invention is to provide a de-interleaving method for an audio signal of a D2 MAC mode in which audio data interleaved and transmitted in units of packets is input to de-interleave the interleaved audio data into normal audio data.

Another object of the present invention is to provide a de-interleaving apparatus for the de-interleaving method.

To accomplish the first object of the present invention, there is provided a method for de-interleaving audio data of the D2 MAC mode which is interleaved in units of packets and transmitted, comprising the steps of: generating a write address for storing the interleaved audio data in units of packets; storing the interleaved audio data according to the write address in units of packets; generating a read address for reading out the audio data stored in units of packet in a de-interleaving order; and reading out the stored audio data according to the read address.

To accomplish the second object of the present invention, there is provided a de-interleaving apparatus for de-interleaving audio data of a D2 MAC signal which is interleaved in units of packets and transmitted, comprising: means for generating a write address for storing the input audio data of the D2 MAC signal in units of packets; means for generating a read address for de-interleaving the stored audio data of the D2 MAC signal in units of packets so that the audio data is arranged in the sequence of pre-interleaving a plurality of RAMs for storing the audio data of the D2 MAC signal according to the write address applied from the write address generating means and for reading out the stored audio data according to the read address applied from the read address generating means; and a plurality of selectors for receiving the write address and read address from the write address generating means and read address generating means so as to apply the wr ite and read addresses to corresponding RAMs in units of packets of audio data.

DETAILED DESCRIPTION OF THE PREFERRED EMBODIMENTS

In one embodiment of the present invention, de-interleaving is performed in such a manner that audio data in synchronization with a line sync signal and a frame sync signal is input to be stored in a memory in units of packets and the stored data is read out by intervals of 8 bits.

Figure 1:
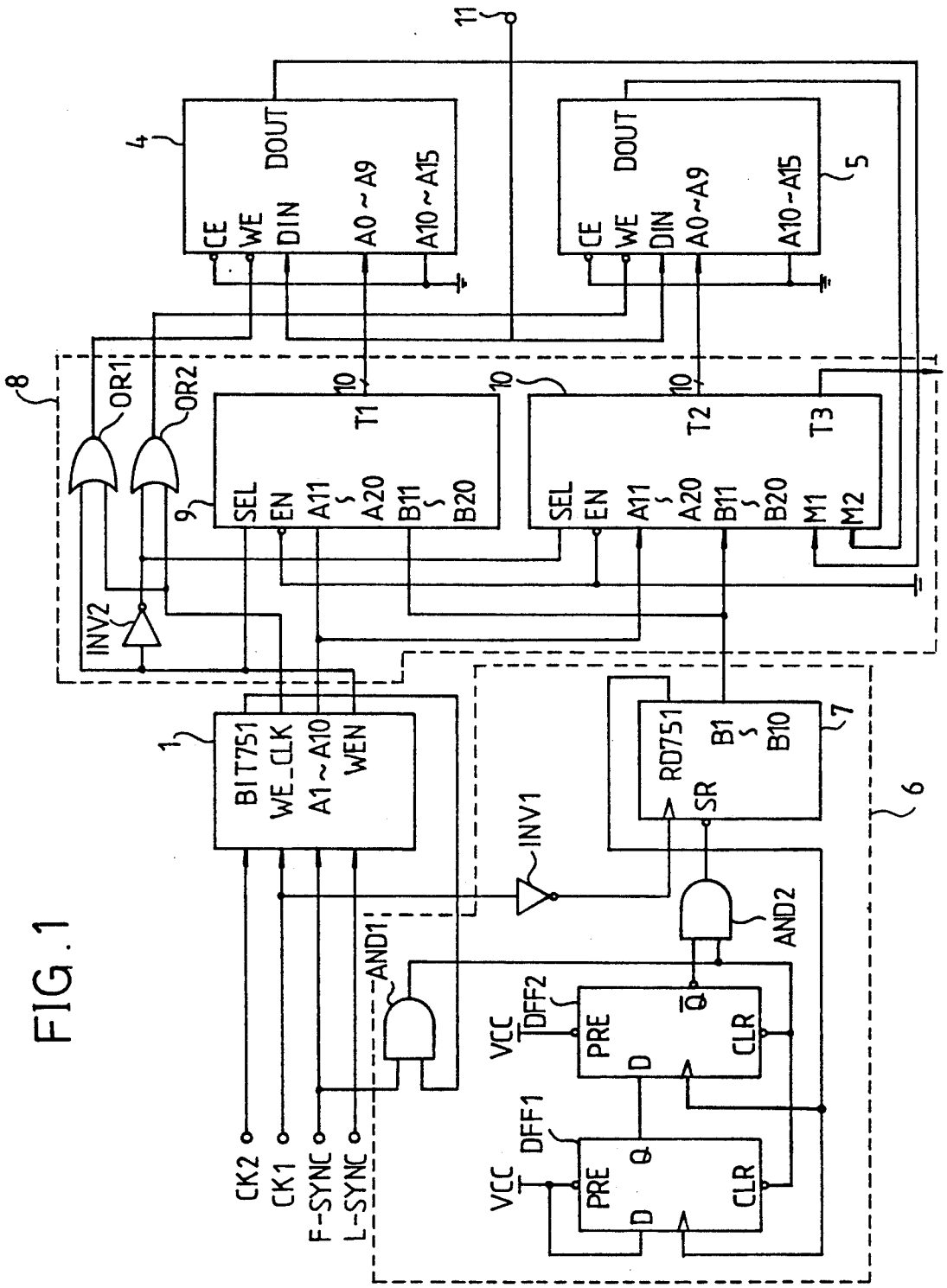
FIG. 1 is a circuit diagram of one embodiment of a de-interleaving apparatus according to the present invention.

Referring to FIG. 1, the de-interleaving apparatus of the present invention comprises a write address generator 1 for receiving a frame sync signal F-SYNC, a line sync signal L-SYNC and clocks CK1 and CK2 and for outputting write-address-related signal WE_CLK, A1-~A10 and WEN for storing one packet of audio data in a memory and a 751-bit count signal BIT751, a read address generator 6 for receiving frame sync signal F-SYNC, first clock CK1 and the 751-bit count signal BIT751 of write address generator 1 so as to generate a memory read address, first and second RAMs 4 and 5 for storing one packet of audio data, and a selector 8 for receiving the output signals of write address generator 1 and read address generator 6, and for switching the memory read/write addresses in units of packets to apply them to first and second RAMs 4 and 5.

Read address generator 6 comprises a first AND gate AND1 for receiving frame sync signal F-SYNC and count signal BIT751, a first inverter INV1 for receiving the first clock CK1 and inverting and outputting the received first clock, a second 751-bit counter 7 for receiving the output signal of the inverter INV1 as a clock signal so as to output count signal RD751 and pulse signals B1-B10, a first D-flipflop DFF1 for connecting power voltage VCC to its data input port D, a second D-flipflop DFF2 for connecting its data input port D to the data output port Q of first D-flipflop DFF1, and a second AND gate AND2 for logically operating upon the output signal of first AND gate AND1 and the output signal of second D-flipflop DFF2. D-flipflop DFF1 and DFF2 connect power VCC to the respective preset ports PRE. The output signal of the first AND gate AND1 is input to clear ports CLR of the D-flipflops. The clock input ports of the D-flipflops receive count signal RD751 of the second 751-bit counter 7.

Selector 8 comprises a first multiplexer 9 having input ports A11–A20 connected to output ports A1–A10 of write address generator 1, input ports B11–B20 connected to output ports B1–B10 of read address generator 6 and a selection port SEL for receiving write enable signal WEN of write address generator 1, a second multiplexer 10 having input ports A11–A20 connected to output ports A1–A10 of write address generator 1, input ports B11–B20 connected to output ports B1–B10 of read address generator 6 and a selection port SEL for receiving inverted write enable signal WEN of write address generator 1, a second inverter INV 2 for inverting and outputting write enable signal WEN of write address generator 1, a first OR gate OR1 for receiving write enable signal WEN and clock WE_CLK of write address generator 1, and a second OR gate OR2 for logically operating clock WE_CLK of write address generator 1 and the output signal of second inverter INV2.

In addition to the input ports of the first multiplexer 9, second multiplexer 10 further comprises two input ports M1 and M2 which receive the respective outputs of RAMs 4 and 5, and outputs the received signals through an output port T3 according to selection signal SEL. Second multiplexer 10 selects signal input port M2 connected to second RAM if selection signal SEL is at a high level signal, and it selects signal input port M1 connected to first RAM 4 if selection signal SEL is at a low level signal. Enable ports EN of first and second multiplexers 9 and 10 are grounded so that the multiplexers are operated in a low level. Multiplexers 9 and 10 connect read address output ports B1–B10 of read address generator 6, offsetting 8 bits with respect to write address output ports A1–A10 of write address generator 1. That is, output ports B1–B10 of second 751-bit counter 7 of read address generator 6 are connected to input ports B11–B20 of multiplexers 9 and 10 so that the interleaved audio data stored in RAMs 4 and 5 is read out by intervals of 8 bits.

The first RAM4 connects its input ports A0–A9 to an output port T1 of first multiplexer 9. The output signal of first OR gate OR1 of selector 8 is input to write enable signal port WE of the first RAM 4. The second RAM 5 connects its input ports A0–A9 to an output port T2 of second multiplexer 10. The output signal of second OR gate OR2 of selector 8 is input to write enable signal port WE of the second RAM 5. The two RAMs 4 and 5 include data input ports DIN and data output ports DOUT. The output signal of first RAM 4 is input to input port M1 of second multiplexer 10 and the output signal of second RAM 5 is input to input port M2 of second multiplexer 10.

Figure 2:
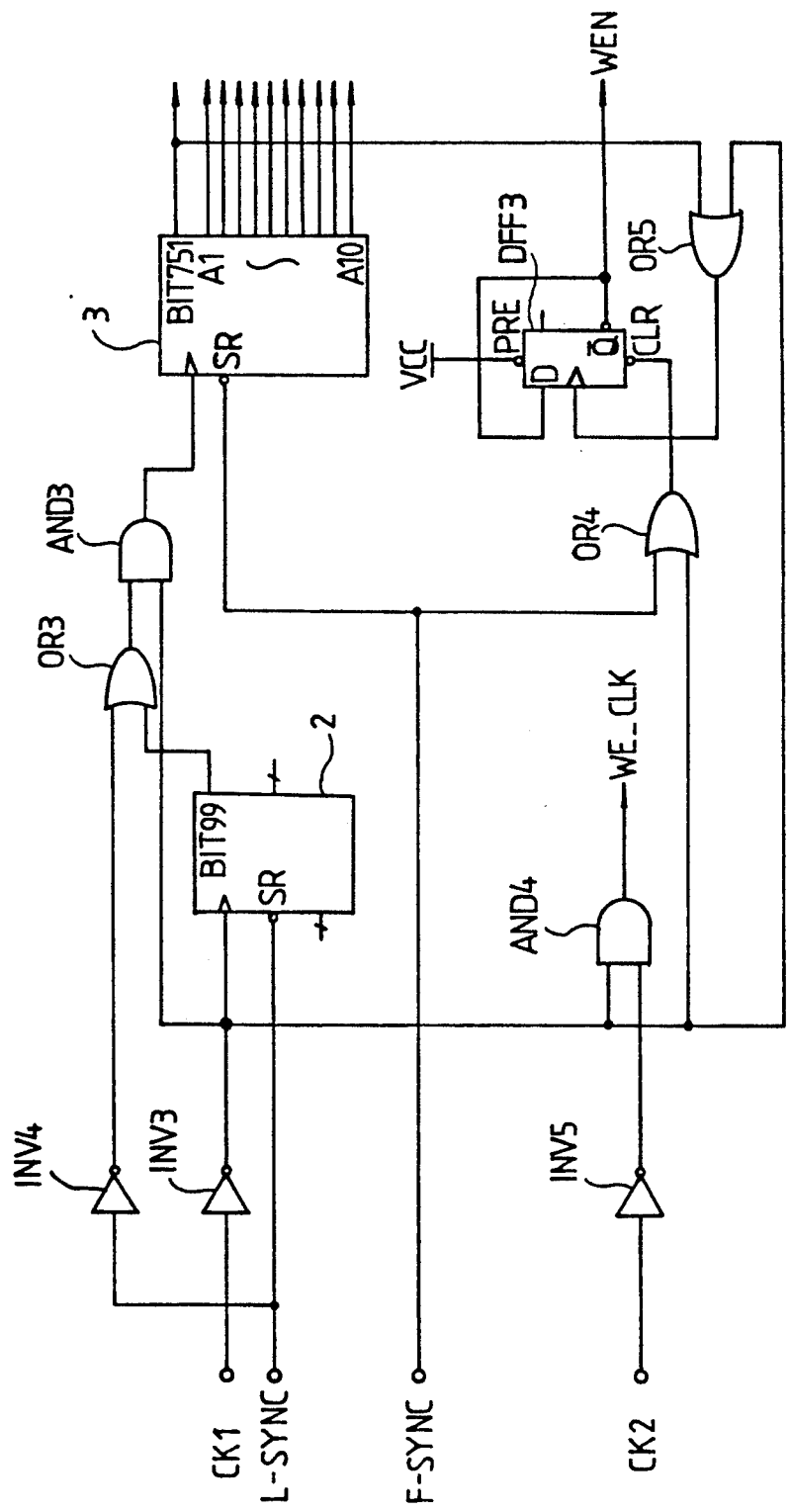
FIG. 2 is a detailed circuit diagram of a write address generator shown in FIG. 1.

Referring to FIG. 2, the write address generator comprises a third inverter INV3 for receiving and inverting first clock CK1, a 99-bit counter 2 for receiving line sync signal L-SYNC through reset port SR so as to count the pulse of the output signal of third inverter INV3, a fourth inverter INV4 for receiving and inverting line sync signal L-SYNC, a third OR gate OR3 for receiving the output signal of fourth inverter INV4 and a count signal BIT99 of 99-bit counter 2, a third AND gate AND3 for logically operating the output signal of third OR gate OR3 and the output signal of third inverter INV3, a fourth AND gate AND4 for receiving the output signals of third inverter INV3 and fifth inverter INV5 so as to generate a write enable clock WE_CLK, a first 751-bit counter 3 for receiving frame sync signal F-SYNC through reset port SR, for counting the pulse of the output signal of third AND gate AND3 and for outputting a counting end signal BIT751 and pulse signals A1–A10, a fourth OR gate OR4 for receiving frame sync signal F-SYNC and the output signal of the third inverter INV3, a fifth OR gate OR5 for receiving count signal BIT751 of first 751-bit counter 3 and the output signal of third inverter IN3, and a third D-flipflop DFF3 in which power VCC is input through preset port PRE, the output signal of fourth OR gate OR4 is input through clear port CLR, and the output signal of data output port Q' is feedback to data input port D. The output signal of fifth OR gate OR5 is input to clock port of the third D-flipflop.

Figure 3A:
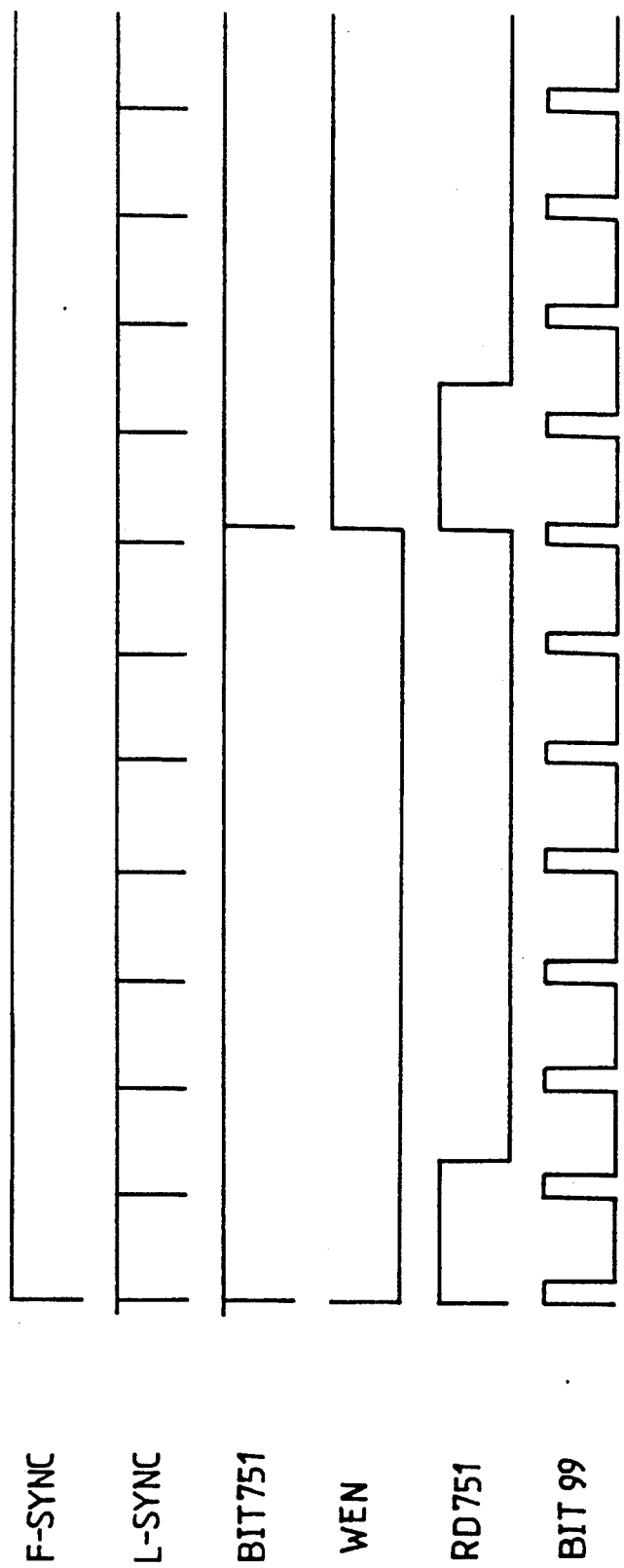
FIGS. 3A and 3B are signal timing diagrams of the de-interleaving apparatus.
Figure 3B:
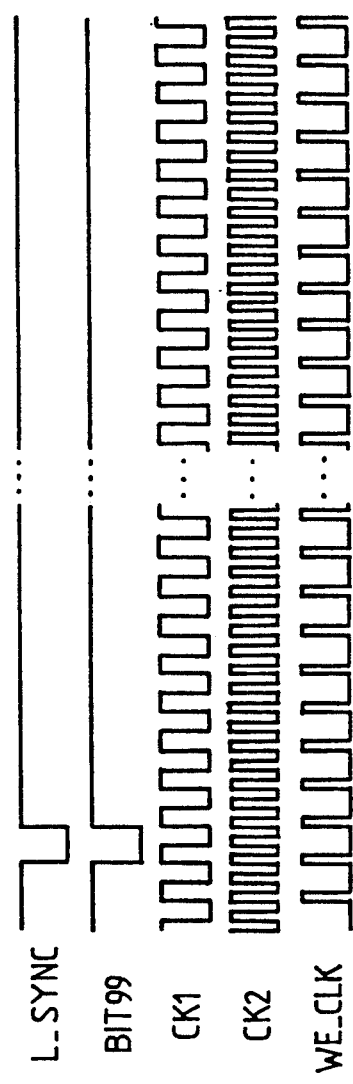

FIGS. 3A and 3B show the relations of signals of the circuits using, as basic clocks, first clock CL1 having the period corresponding to one bit of a D2 MAC signal and second clock CK2 having half the period of the first clock. Read enable clock WE_CLK has the same period as that of first clock CK1 but has half the high-level pulse width of first clock CK1.

When frame sync signal, F-SYNC and line sync signal L-SYNC are input to the apparatus shown in FIG. 1, write address generator 1 receiving clocks CK1 and CK2 outputs write-address-related signals using built-in 99-bit counter 2 and first 751-bit counter 3. That is, the write address generator produces the write-address-related signals for storing audio data contained in the 99-bit area of each line into first and second RAMs 4 and 5 in units of 751 bits. The operation of write address generator 1 will be described below in detail with reference to FIGS. 2, 3A and 3B.

First and second clocks CK1 and CK2 shown in FIG. 3B are inverted by third and fifth inverters INV3 and INV5 to be input to write address generator 1. Write address generator 1 produces new write addresses according to the input of frame sync signal F-SYNC and line sync signal L-SYNC of low level pulse. 99-bit counter 2 counts first clock CK1 inverted by third inverter INV3, and outputs high-level pulse signal BIT99 during counting. 99-bit counter 2 is reset by the low pulse of line sync signal L-SYNC. The output signal BIT99 of 99-bit counter 2 is logically summed with the inverted line sync signal and logically multiplied by the inverted first clock. Thus, first 751-bit counter 3 counts by receiving the inverted first clock as a clock signal. During the counting of the input clocks, first 751-bit counter 3 generates and outputs memory write addresses through output ports A1-A10. When the 751-bit counting is finished or frame sync signal F-SYNC is input, 751-bit counter 3 is reset and outputs a low-level pulse corresponding to one period of the first clock CK1. When the 751-bit counting is being carried out or the frame sync signal is not input, a high-level signal is continuously output.

Fourth AND gate AND4 receives the inverted signals of first and second signals CK1 and CK2 so as to generate write enable clock signal WE_CLK shown in FIG. 3B. Third D-flipflop DFF3 receives, as a clock, the resultant signal in which the inverted signal of first clock CK2 and count signal BIT751 of first 751-bit counter 3 are logically summed. Thus, third D-flipflop DFF3 alternately outputs a low-level pulse signal and high-level pulse signal by intervals of 751-bit counting.

First AND gate AND1 of read address generator 6 receives the frame sync signal and count signal BIT751 of write address generator 1 which are low-level pulses, so as to clear first and second D-flipflops DFF1 and DFF2. Thus, second 751-bit counter 7 is reset by the output signal of second AND gate AND2 and counts first clock CK1 received via first inverter INV1. Since second 751-bit counter 7 is reset only by the low-level pulse of frame sync signal F-SYNC and count signal BIT751 of write address generator 1, read address generator 6 generates continuous memory read addresses, contrary to write address generator 1.

Selector 8 receives write enable signal WEN from write address generator 1 and selects the output signals of multiplexers 9 and 10. Specifically, the selector selectively outputs the address signals of write address generator 1 and read address generator 6 using write enable signal WEN and the inverted write enable signal inverted by inverter INV2.

Since first RAM 4 uses the output signal of first OR gate OR1 as its write enable signal WEN, the first RAM stores input data during the low level of write enable signal shown in FIG. 3A. Meanwhile, since second RAM 5 uses the output signal of second OR gate OR2 as write enable signal WEN, the second RAM stores input data during the high level of write enable signal WEN output from write address generator 1.

When audio data is input via data input port 11, first RAM stores the input audio according to the address signals of write address generator 1 and first multiplexer 9. That is, when the output signal BIT99 of 99-bit counter 2 and count signal BIT751 of first 751-bit counter 3 are both in a high level and write enable signal WEN is in a low level, the first RAM stores the audio data input via data input port 11. Therefore, first RAM 4 stores one packet of 751 bits by storing 99 bits of audio data for every line. While first RAM 4 stores data, first RAM 5 outputs one packet of stored data according to the address signals of read address generator 6 and second multiplexer 10. Read address signal input ports B11-B20 of first and second RAMS 4 and 5 are arranged offsetting 8 address value with respect to write address signal input ports A11-A20.

For instance, write address signal input port A14 is arranged to correspond to read address signal input port B11. The read addresses output from multiplexers 9 and 10 are applied to RAM 4 or 5 by intervals of 8 bits of interleaved audio data. Accordingly, the apparatus shown in FIG. 1 de-interleaves the interleaved audio data using only a method for reading stored data.

When one packet of audio data is completely stored, first RAM 4 outputs stored audio data through output port T3 of second multiplexer 10. At the same time, second RAM 5 begins to store audio data input via input port 11 according to the address signal input via address output port 12 of second multiplexer 10. When one packet of audio. data. is stored, second RAM 5 outputs stored audio data through output port T3 of second multiplexer 10 according to the control signal of selector 8. First RAM 4 stores audio data input via input port 11 during the data output time of second RAM 5. The data write/read operation of first and second RAMs 4 and 5 allows for continuous de-interleaving of input audio data.

As described above, the de-interleaving method and apparatus of the present invention receives audio data of the D2 MAC mode interleaved in units of packets to be transmitted, and de-interleaves the audio data using only a simple memory input output control, to thereby enhance the error correction capability of data.

What is claimed is:

1. A de-interleaving apparatus for de-interleaving audio data of a D2 MAC signal which is interleaved in units of packets and transmitted, comprising:
    means for generating a write address for storing said audio data of the D2 MAC signal in units of packets;
    means for generating a read address for de-interleaving said stored audio data of the D2 MAC signal in units of packets so that the audio data is arranged in the original sequence before the interleaving;
    a plurality of RAMs for storing said audio data of the D2 MAC signal according to the write address generated from said write address generating means and for reading out the stored audio data according to the read address generated from said read address generating means; and
    a plurality of selectors for receiving the write address and read address generated from said write address generating means and read address generating means, respectively, and for applying the received write and read addresses to corresponding RAMs in units of packets of audio data.

2. The de-interleaving apparatus as claimed in claim 1, wherein said write address generating means comprises:
    a first counter for counting audio data contained in each line of the D2 MAC signal; and
    a second counter for generating RAM write address for storing one packet of audio data only during the counting operation of said first counter.

3. The de-interleaving apparatus as claimed in claim 2, wherein said write address generating means comprises a third counter for when one packet of write address for one of said plurality of RAMs is completely generated, generating read address for another one of said plurality of RAMs.

4. The de-interleaving apparatus as claimed in claim 3, wherein said read address generating means applies the generated read address to said RAMs for reading out interleaved audio data stored in said RAMs by said write address generating means by predetermined intervals.

5. A method for de-interleaving audio data of a D2 MAC mode which is interleaved in units of packets and transmitted, comprising the steps of:

generating a write address for storing said interleaved audio data in units of packets;

storing said interleaved audio data according to the generated write address in units of packets;

generating a read address for reading out said audio data stored in units of packets in a de-interleaving order; and reading out said stored audio data according to the generated read address.

* * * * *